United States Patent [19]

Gnadinger

[11] Patent Number: 5,229,647
[45] Date of Patent: Jul. 20, 1993

[54] HIGH DENSITY DATA STORAGE USING STACKED WAFERS

[75] Inventor: Alfred P. Gnadinger, Colorado Springs, Colo.

[73] Assignee: Micron Technology, Inc., Boise, Id.

[21] Appl. No.: 947,942

[22] Filed: Sep. 21, 1992

Related U.S. Application Data

[63] Continuation of Ser. No. 675,795, Mar. 27, 1991, abandoned.

[51] Int. Cl.⁵ .................................. H01L 23/16
[52] U.S. Cl. ............................ 257/785; 257/686; 257/774
[58] Field of Search ............ 257/621, 686, 738, 748, 257/774, 777, 785

[56] References Cited

U.S. PATENT DOCUMENTS

| | | | |
|---|---|---|---|
| 3,239,719 | 3/1966 | Shower | 357/80 |
| 3,813,773 | 6/1974 | Parks | 29/830 |
| 4,761,681 | 8/1988 | Reid | 357/68 |
| 4,807,021 | 2/1989 | Okumura | 357/75 |
| 4,897,708 | 1/1990 | Clements | 357/65 |
| 4,954,875 | 9/1990 | Clements | 357/75 |
| 4,984,358 | 1/1991 | Nelson | 29/830 |
| 5,089,880 | 2/1992 | Meyer et al. | 257/785 |

Primary Examiner—Andrew J. James
Assistant Examiner—Sara W. Crane
Attorney, Agent, or Firm—Arnold, White & Durkee

[57] ABSTRACT

A solid-state memory unit is constructed using stacked wafers containing a large number of memory units in each wafer. Vertical connections between wafers are created using bumps at the contact points and metal in through-holes aligned with the bumps. The bumps on one wafer make contact with metal pads on a mating wafer. Mechanical bonding between the bumps and mating metal pads on another wafer is preferably avoided so that fractures due to thermal expansion differentials will be prevented. Serial addressing and data access is employed for the memory units to minimize the number of connections needed. Also, the metal pads, through-holes and bumps are formed at corners of the die and thus shared with adjacent units whenever possible, further reducing the number of vertical connections.

14 Claims, 3 Drawing Sheets

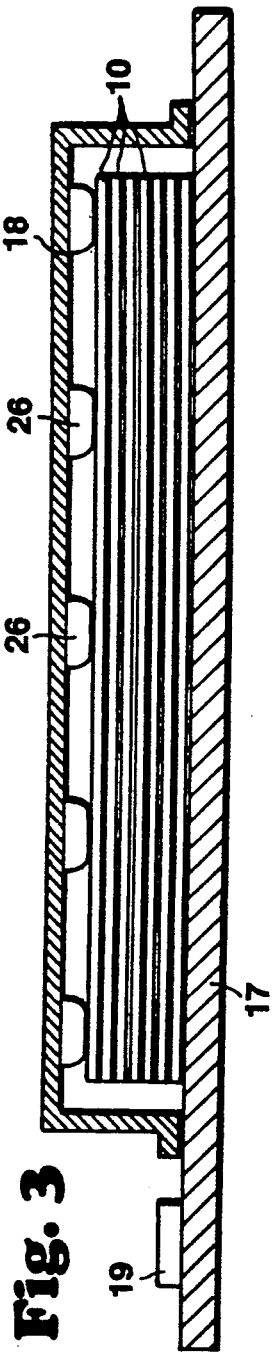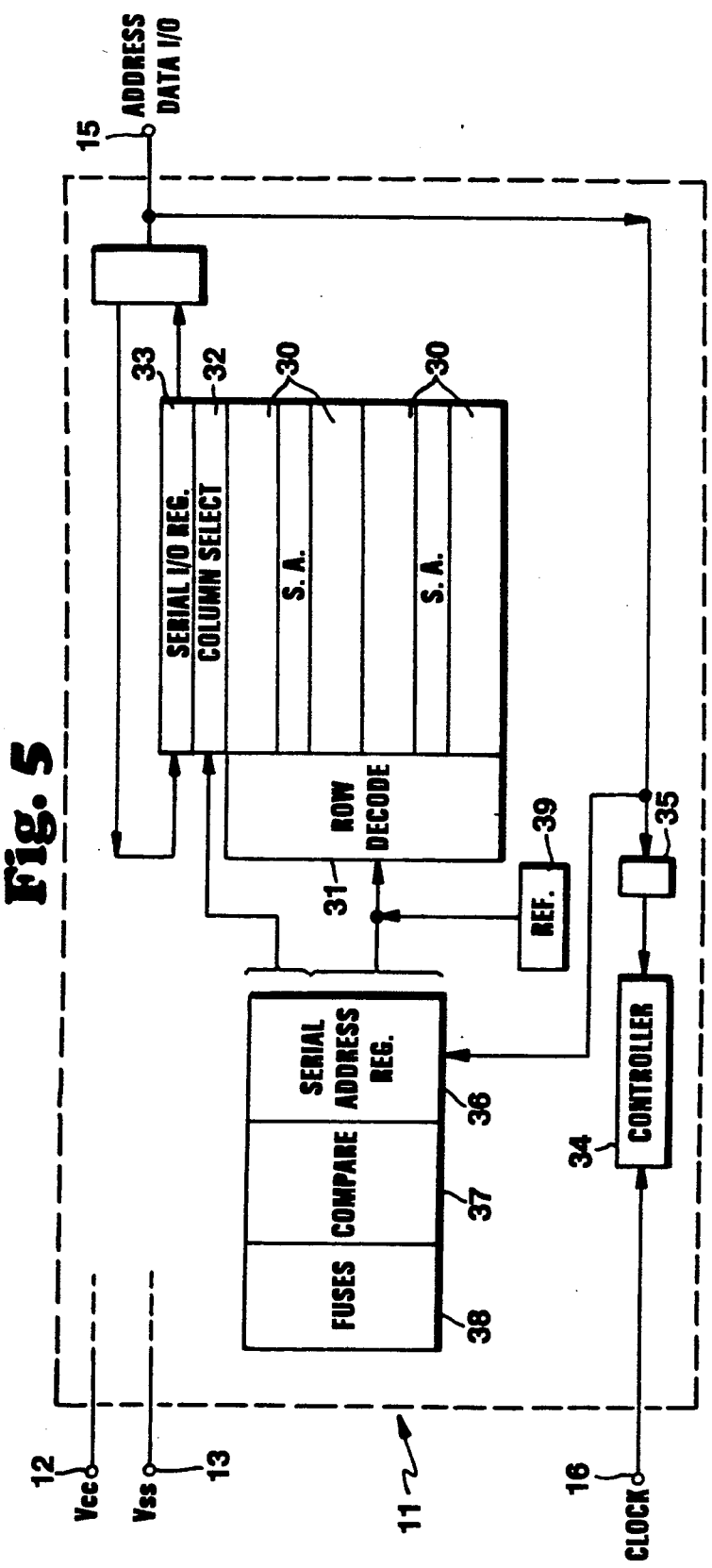

HIGH DENSITY DATA STORAGE USING STACKED WAFERS

CROSS-REFERENCE TO RELATED APPLICATION

This application is a continuation of application Ser. No. 07/675,795, filed Mar. 27, 1991, now abandoned.

BACKGROUND OF THE INVENTION

This invention relates to semiconductor memory devices, and more particularly to bulk memories using multiple non-diced wafers of semiconductor memory units integrated as a single structure.

High density memory systems have been proposed which use so-called "wafer scale" integration, i.e., whole wafers are left intact rather than being broken into individual chips. One example was a construction proposed by Trilogy Corporation, in which chips which tested good in a wafer were interconnected with additional discrete wiring; this approach presented technical difficulties associated with the discrete wiring, resulting in poor yields and thus high cost. Another approach was proposed by Anamartic, Ltd. of Cambridge, U.K., in which DRAM chips were used while still in wafer form and the good chips were interconnected using a software mapping scheme to block out the bad chips, with two whole wafers being placed back-to-back on a PC board; a serial access through all intermediate chips was used, however, and the unit was thus slow because of the long paths. A different approach was proposed by Mass Memory Technology of Scots Valley, Calif., in which whole wafers of DRAMs using serial access were employed, with interconnection between wafers provided by through-holes etched into the wafers; bundles of gold wires were threaded through the holes to make vertical interconnections, thus allowing wafers to be stacked one on top of the other, producing very high packing density. The gold wires used in the Mass Memory approach were pliable and could accommodate relative motion of the wafers due to variable thermal expansion. However, this method using gold wires required substantial additional wafer processing, involving sequential insertion of the wires using automated equipment, and so the cost was prohibitive.

The cost of a memory unit such as a 16-Mbit DRAM, while still in wafer form, is much less than that of a mounted and packaged chip containing the same memory unit. If these semiconductor memory units could be packaged and used in wafer form, and reliable and inexpensive interconnections made, then a very low cost bulk memory system could be manufactured, providing advantages over hard disk technology. A semiconductor bulk memory constructed in this manner would be orders of magnitude faster than hard disk, and would be more reliable because no moving parts are used.

It is the principal object of this invention to provide a low-cost semiconductor memory construction, particularly a memory system using wafer scale integration of memory units. Another object is to provide an improved method of interconnecting memory units in a wafer, and interconnecting wafers, in a stacked wafer construction of a memory system. Another object is to provide an improved data storage system employing serial DRAMs in a stacked wafer arrangement. A further object is to provide a method of making vertical interconnections in a stacked wafer semiconductor device. An additional object is to provide an improvement in low cost memory construction.

SUMMARY OF THE INVENTION

In accordance with one embodiment of the invention, a solid-state memory unit is constructed using stacked wafers containing a large number of memory units in each wafer. Vertical connections between wafers are created using bumps in through-holes aligned with metal pads. The bumps on one wafer make contact with metal pads on a mating wafer. Mechanical bonding between the bumps and mating metal pads on another wafer is preferably avoided so that fractures due to thermal expansion differentials will be prevented. Serial addressing and data access are employed for the memory units to minimize the number of connections needed. Also, the metal pads, through-holes and bumps are formed at corners of the die and thus shared with adjacent units whenever possible, further reducing the number of vertical connections.

BRIEF DESCRIPTION OF THE DRAWINGS

The novel features believed characteristic of the invention are set forth in the appended claims. The invention itself, however, as well as other features and advantages thereof, will be best understood by reference to the detailed description of specific embodiments which follows, when read in conjunction with the accompanying drawings, wherein:

FIG. 3 is an elevation view in section of a memory system constructed using stacked wafers of FIG. 1;

FIG. 5 is an electrical diagram in block form of a DRAM memory unit as may be used in the wafers in the construction of FIGS. 1-4.

DETAILED DESCRIPTION OF SPECIFIC EMBODIMENTS

Figure 1:
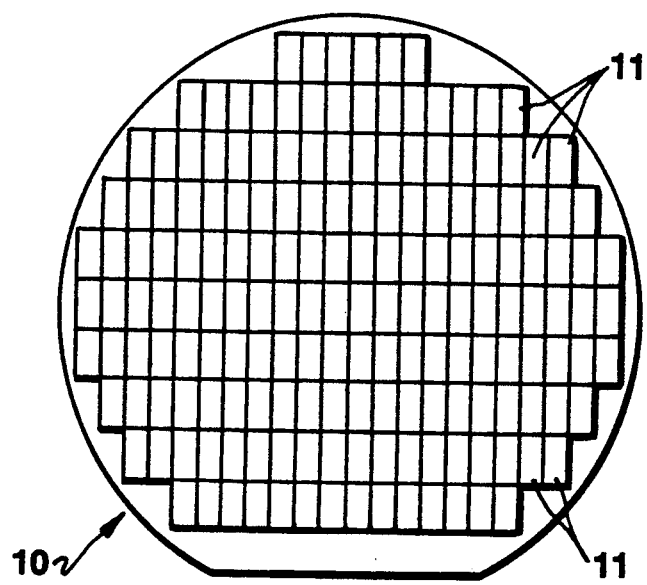
FIG. 1 is a top view of a silicon wafer having a number of memory units formed therein, as may be used in one embodiment of the invention.

Referring to FIG. 1, a semiconductor wafer 10 is shown having a large number of memory chips 11 formed therein, where each one of the memory chips 11 is a complete memory unit such as a dynamic RAM of the 4-Mbit or 16-Mbit size or larger, constructed by CMOS technology, for example. The memory devices are not physically broken into individual chips as is the usual case for mounting in DIP or SIP packages, but instead the entire wafer, for example 150 mm in size, as manufactured, is used as a complete unit in undivided form. There may be perhaps about 140 memory units 11 in the wafer 10, or more. This would provide about 560-Mbit or 70-Mbyte of storage per wafer 10.

Figure 2:
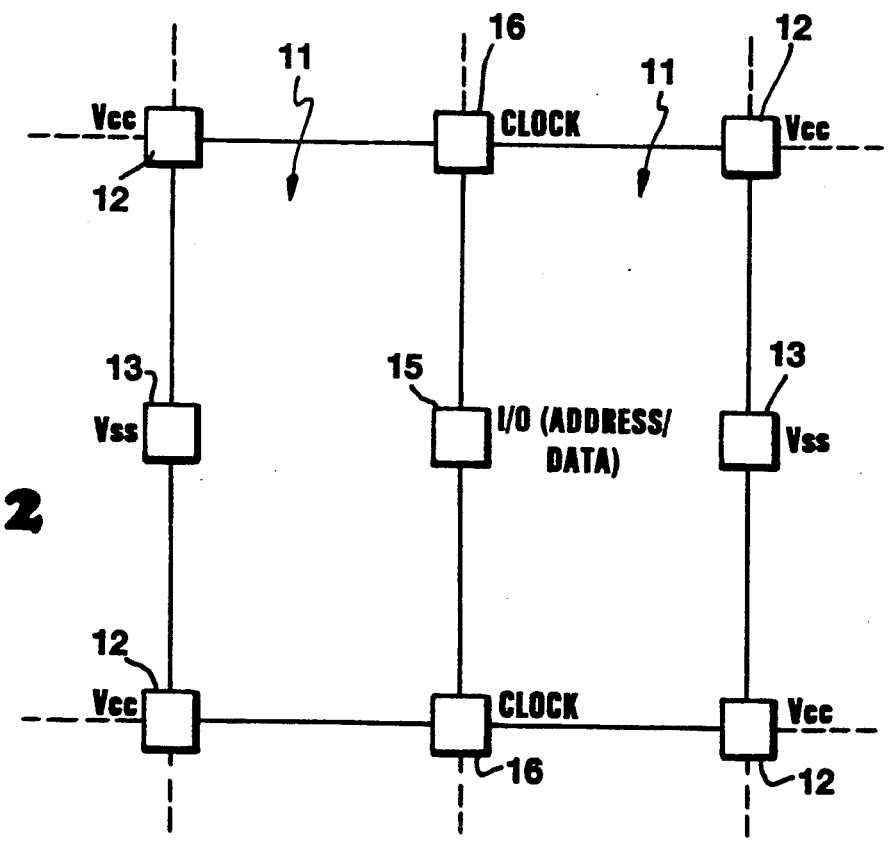
FIG. 2 is an enlarged view of two of the memory units in the wafer of FIG. 1.

In FIG. 2 an enlarged view of two of the chips 11 is shown, where it is seen that there are a small number of electrical connections to each chip, these being in this example a power supply or Vcc connection 12 at each corner of a pair of chips 11, a ground or Vss connection 13 on each side of a pair, a combined address input and data input/output 15 for each pair, and a clock input 16 at top and bottom. The layout of FIG. 2 is used so that the connections to a pair are symmetrical and the reticle of a pair can be stepped in any direction. The DRAM is serially operated, with the address being clocked in at the input 15 (only one of the two chips 11 will respond to an address due to the laser-fusing as described below), along with a read or write command, then the data being clocked in or out in a serial manner by the same connection 15. Data is handled in blocks, e.g., page size (commonly 4Kbyte), rather than by addressing individual bits, so the penalty of serial addressing is relatively small. The Vcc power supply connection 12 and the clock 16 are each located in corners and shared with three adjacent chips 11. The Vss ground connection 13 is located in the middle of one edge of the chip 11 and is shared with one adjacent chip. The address/data connection 15 is shared for each pair of each chip 11. Thus, there are on average only three connections per chip 11 or 420 connections per wafer 10 (assuming 140 chips per wafer). Individual chips or groups of chips are tailored to respond to certain addresses, as by laser fusing or the like, so the same address can be applied to all the chips on a wafer and only the correct one or ones will respond.

Figure 4:
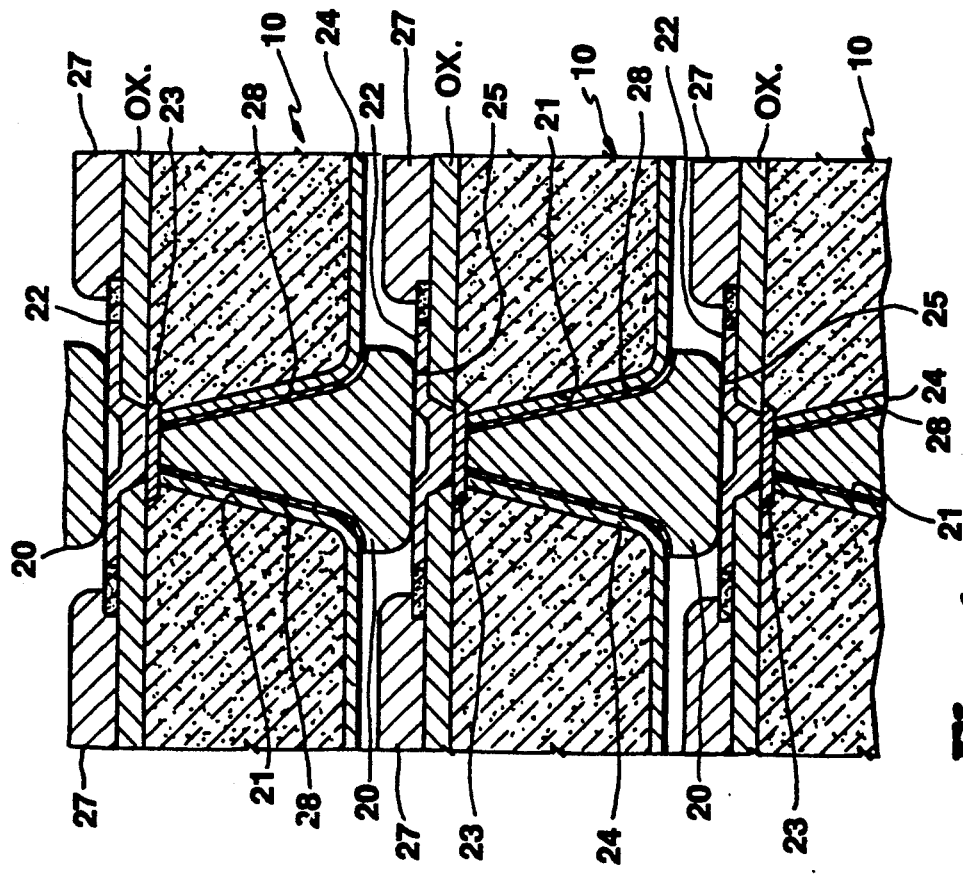
FIG. 4 is an enlarged view of vertical interconnections between wafers in the construction of FIG. 3, using concepts of the invention.

Referring to FIG. 3, a number of the wafers 10 are mounted in a stack on a printed circuit board 17, within an enclosure 18 hermetically sealed to the printed circuit board. Other components 19 such as a gate array for memory control and ECC functions are also mounted on the printed circuit board 17 to provide a complete memory system in a size and form factor for mounting in a standard expansion board slot or in a disk bay of a desktop computer or workstation. This stacking of the wafers 10 requires that vertical interconnects be made to the connections 12-15, and to this end a structure as seen in the enlarged view of FIG. 4 is employed, according to one embodiment of the invention. Metal bumps 20 are created at each of the positions where the connections 12-15 are needed, and these bumps are extended through the wafers 10 by vertical through-holes 21 etched in the silicon material of the wafer. The bumps engage metal pads 22 formed on the upper face of the wafers 10, and the interior ends of bumps connect to the pads 22 by N+ diffused regions 23 if the wafer is P-type (or, if an N-type wafer is employed, to P+ regions). Alternatively, the bumps may contact directly with the metal pads 22, rather than with the diffused regions 23, in which case an etch creating the through-hole would stop on the metal rather than on the diffused region. The interior sidewalls of the through-holes are coated with an insulator 24 such as silicon oxide or silicon nitride so that there is no electrical connection between the metal of the bump and the silicon of the wafer except thorough the intentional interconnect pattern via the diffused regions 23 (or to the metal pads 22 directly).

The metal of the bumps 20 and the metal of the pads 22 are chosen so that these metals do not form a rigid mechanical bond at the interface 25 between wafers 10. This is necessary so that the wafers 10 can move laterally with respect to one another to accommodate the potentially differing thermal expansion which would likely break off a bump from its anchoring location. A reliable electrical connection is made, however, by the use of a malleable metal such as gold or a gold alloy as the material for the bumps 20, and by applying a mechanical force to the stack of wafers in the packaging of FIG. 3, as by springs or resilient pads 26 which maintain a firm but limited force on the stack of wafers. The bumps 20 must of course be of a uniform and predetermined height, dimensionally controlled, to assure that all bumps are the same height. The material of the metal pads 22 is preferably aluminum as is commonly used for bonding pads on silicon integrated circuit chips. Alternatively, aluminum with a thin layer of titanium-tungsten or titanium-nitride may be used as the metal pads 22. The material used for the metal pads should of course be compatible with standard CMOS processing used to manufacture the wafers 10. A method of creating the bumps 20 and pads 22 is set forth in a product brochure by EM Microelectronic-Marin S. A., of Marin, Switzerland, entitled "EM Bumping Service".

The semiconductor wafers 10 are processed normally up through the step of metallization and patterning to form the metal pads 22, then applying a passivation (oxide or nitride) layer 27 on the top face of the wafers and patterning to expose the pads 22. Through-holes 21 are then etched from the backside of the wafers, using a wet-etch or reactive ion etch, stopping on the diffused regions 23. That is, in such a method, the through-hole does not extend all the way through the wafer. In another embodiment, an etch is used that stops on metal, in which case the holes go all the way through to the underside of the metal pads 22. A protective insulator layer 24 is then applied, as by depositing silicon oxide or silicon nitride, and a thin metal coating 28 is applied by evaporation or sputtering then patterned by photoresist mask and etch to define the area of the bumps. The material of the bumps is deposited by plating on the metal 28, for example, to fill the through-holes 21 and build up to the desired uniform height. A photoresist mask is used to define the bumps during this plating operation.

Referring to FIG. 5, one of the memory units 11 is illustrated in block form. The unit includes an array 30 of DRAM cells, preferably of very high density, such as 16-Mbit or more. A row decoder 31 selects one of 2048 or 4096 rows (for 16-Mbit DRAMs), or however many rows are provided, depending upon the partitioning of the cell array (dictated by refresh specification). If column decode is employed, a column decoder 32 selects a block from the 8192 or 4096 columns (in the 16-Mbit example) for input or output. A serial register 33 is employed as in video DRAMs so that data can be clocked in or out independent of the array after the serial register is loaded (refresh can be implemented during a serial output operation, for example). The serial register 33 is coupled to the address/data input/output terminal 15 under control of a controller 34 which is responsive to commands clocked into the address/data terminal 15. A command register 35 receives these commands, indicating a read, a write or a refresh operation, and if a read or write the address follows. A serial address register 36 receives addresses clocked into the address terminal 14 and each new address is compared to a unique chip address in a comparator 37. A fuse matrix 38 is set by laser or electrical fusing to produce an address for this unit, to differentiate it from all the other chips on the wafer. If the address matches, the controller 34 is activated to cause the row address to be loaded to the row decoder 31 and the column address to be loaded to the column decoder 32. A number of clocks later, depending upon the speed of array access, the input or output begins. If this is a read cycle, the data in the row addressed is transferred from the array 30 to the serial register 33 in one clock cycle and begins to be clocked out on the next. If this is a refresh cycle, no address input at connection 15 is needed, since a refresh counter 39 is employed to keep count of which row was last refreshed. After each refresh cycle, the counter 39 is incremented.

The wafers 10 are mounted in a dense stack, with the only direct face-to-face contact with anything that would function as a heat sink being with the PC board 17, so power dissipation must be kept to a minimum. The use of CMOS technology of course is inherently low power, but also the amount of heat generated is low due to the fact that only one chip (or a small number) in a wafer is ordinarily activated during each read or write cycle, since only one will be addressed. For refresh, of course, every chip is activated for every row during each refresh period (typically 16-millisec. or more) but as ordinarily operated this is merely for about a 100-nanosec period every several microseconds (usually every 15.6 microsecond as commonly specified), i.e., less than one-fiftieth of the time. Thus, the overall average period of activation of a given chip is a small fraction of the time, so undue build-up of heat does not occur. Note that during the time a chip is outputting data by the serial register 33, the sense amplifiers in the cell array 30 need not be activated except for the initial cycle when the serial register 33 is loaded (except for refresh); the sense amplifiers draw the most current and contribute the most to peak current.

A memory system constructed as in FIG. 3, employing 4-Mbit DRAMs, with 140 chips per wafer, and nine wafers 10 in a stacked configuration (byte-wide data plus parity), provides 560-Mbytes of storage. By employing data compression as set forth in copending application Ser. No. 672,722, filed Dec. 14, 1990, by William D. Miller et al, assigned to CERAM, Inc., assignee of this invention, the storage of the same unit is increased to about 1-Gbyte. Using low power CMOS technology and battery backup for holding data in a non-volatile manner, a solid-state memory functioning as secondary storage like a hard disk is provided, at a cost competitive with hard disk technology. Or, as disclosed in the identified applications, the solid-state disk replacement can be used as swap space for a virtual memory system, in which case it need not be non-volatile. The advantage is in speed, perhaps one hundred times faster than disk access, and in reliability since there are no moving parts. Use of 16-Mbit or 64-Mbit memory chips 11 instead of 4-Mbit increases the storage capacity by a factor of four or sixteen, providing the possibility of about 15-Gbyte storage in a size about that of a half-height hard disk for a PC.

Figure 6:
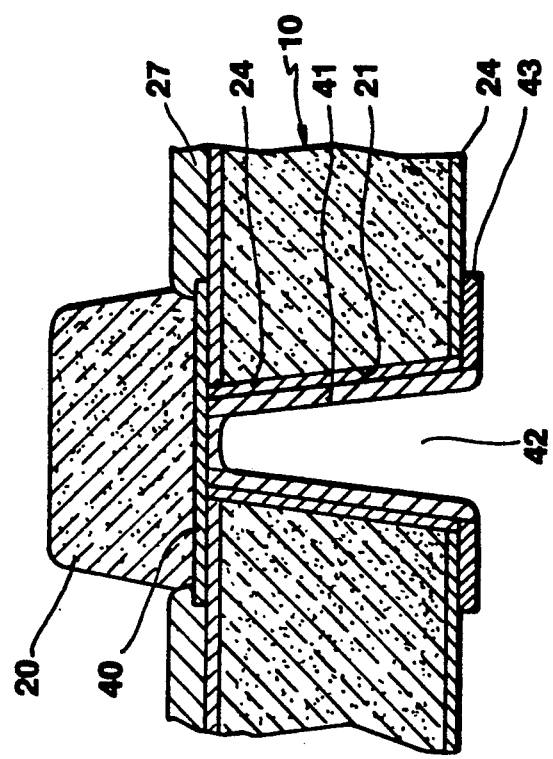
FIG. 6 is an enlarged view of vertical interconnections between wafers as in FIG. 4, according to an alternative embodiment of the invention.

Referring to FIG. 6, in an alternative embodiment the bumps 20 may be formed on the top face of the wafer 10 instead of on the lower face as above. A metal pad 40 is formed on the top face of the wafer, interconnected with the appropriate circuitry of the DRAM, and a passivation layer 27 formed as before. The through-hole 21 is etched, coated with oxide 24, and a metal coating 41 is applied to contact the lower face of the metal pad 40. The hole 21 is perhaps 100–200 micron in diameter and the interior 42 need not be filled with a material (conductive or non-conductive) but could be. A metal pad 43 is formed by metallization and patterning, or this pad 43 could be an extension of the metal coating 41.

Although described herein in the context of memory system employing serially accessed DRAMs, it is apparent that the features of the invention are useful as well in other types of semiconductor devices, such as memory systems employing EPROMs, for example, or various types of processors or the like. The fact that vertical interconnects can be made anywhere on a chip gives advantages in memory cards, for example.

While this invention has been described with reference to specific embodiments, this description is not meant to be construed in a limiting sense. Various modifications of the disclosed embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A stacked wafer device comprising:
    (a) a plurality of semiconductor wafers arranged in a stack;
    (b) each wafer having a plurality of connection pads formed on the upper face of the wafer, the connection pads made of a first metallic material;
    (c) each wafer further having a plurality of through-holes axially aligned with the connection pads, each through-hole extending through the wafer to an opposite face of the wafer;
    (d) each wafer further including a plurality of solid bumps of a second metallic material, each bump engaging and making electrical contact with a connection pad formed on the wafer at an interface and extending through the through-hole of another wafer to make electrical contact with a connection pad formed on the other wafer;
    (e) the first and second metallic materials selected such that the metallic materials do not form a rigid mechanical bond at the interface between the connection pad and the bump.

2. The device of claim 1 wherein the first metallic material comprises aluminum and the second metallic material comprises a malleable metal.

3. The device of claim 2 wherein the second metallic material comprises gold.

4. The device of claim 1 further including means for applying a mechanical force to the stack of wafers in a direction substantially perpendicular to the interface between the connection pad and the bump.

5. The device of claim 4 wherein the means for applying a mechanical force comprises a spring.

6. The memory device of claim 1 wherein each solid bump makes electrical contact to an interior semiconductor region beneath one of said connection pads.

7. A stacked wafer memory device comprising:
    (a) a stack of semiconductor wafers, each wafer including a plurality of memory unit pairs arranged in a regular pattern, the memory unit pairs having a generally rectangular configuration;
    (b) each of the memory unit pairs having four power supply connection areas, one positioned at each corner of the rectangle; two clock connection areas positioned on first opposing sides of the rectangle; two ground connection areas positioned on second opposing sides of the rectangle; and a combined address and input and output connection area, positioned substantially in the center of the rectangle;
    (c) each wafer having a plurality of connection pads formed on the upper face of the wafer at positions defined by the connection areas, the connection pads comprising a first metallic material;

(d) each wafer further having a plurality through-holes axially aligned with the connection pads, each through-hole extending through the wafer to an opposite face of the wafer;

(e) each wafer further including a plurality of solid bumps of a second metallic material, each bump engaging and making electrical contact with a connection pad formed on the wafer at an interface and extending through the through-hole of another wafer to make electrical contact with a connection pad formed on the other wafer;

(f) the first and second metallic materials selected such that the metallic materials do not form a rigid mechanical bond at the interface between the connection pad and the bump.

8. The memory device of claim 7 wherein the first metallic material comprises aluminum and the second metallic material comprises a malleable metal.

9. The memory device of claim 8 wherein the second metallic material comprises gold.

10. The memory device of claim 7 wherein each bump is isolated from the other wafer by an insulator coating on the sidewalls of a through-hole.

11. The memory device of claim 7 wherein each solid bump makes electrical contact to an interior semiconductor region beneath one of said connection pads.

12. The memory device of claim 7 wherein each power supply and clock connection area is shared by four memory units and each ground and combined address and input and output connection area is shared by two memory units.

13. A stacked wafer memory device comprising:

(a) a stack of semiconductor wafers, each wafer including a plurality of memory unit pairs arranged in a regular pattern, the memory unit pairs having a generally rectangular configuration;

(b) each of the memory unit pairs having four power supply connection areas, one positioned at each corner of the rectangle; two clock connection areas positioned on first opposing sides of the rectangle; two ground connection areas positioned on second opposing sides of the rectangle; and a combined address and input and output connection areas, positioned substantially in the center of the rectangle;

(c) each wafer having a plurality of connection pads formed on the upper face of the wafers at positions defined by the connection areas, the connection pads comprising aluminum;

(d) each wafer further having a plurality through-holes axially aligned with the connection pads, each through-hole extending through the wafer to an opposite face of the wafer;

(e) each wafer further including a plurality of solid bumps comprising gold, each bump engaging and making electrical contact with a connection pad formed on the wafer at an interface and extending through the through-hole of another wafer to make electrical contact with a connection pad formed on the other wafer; the bump isolated from the other wafer by an insulator coating on the sidewalls of the through-hole;

(f) wherein the aluminum pad and the gold bump do not form a rigid mechanical bond at the interface between the connection pad and the bump; and (g) means for applying a mechanical force to the stack of wafers in a direction substantially perpendicular to the interface between the connection pad and the bump.

14. The memory device of claim 13 wherein each solid bump makes electrical contact to an interior semiconductor region beneath one of said connection pads.

* * * * *